United States Patent [19]
Owa et al.

[11] Patent Number: 6,088,379
[45] Date of Patent: Jul. 11, 2000

[54] ULTRAVIOLET LASER APPARATUS AND SEMICONDUCTOR EXPOSURE APPARATUS

[75] Inventors: Soichi Owa; Tomoko Ohtsuki, both of Tokyo, Japan

[73] Assignee: Nikon Corporation, Japan

[21] Appl. No.: 09/094,210

[22] Filed: Jun. 9, 1998

[30] Foreign Application Priority Data

Jun. 10, 1997 [JP] Japan .................................... 9-152394

[51] Int. Cl.$^7$ ...................................................... H01S 3/082
[52] U.S. Cl. .................................. 372/97; 372/21; 372/5; 372/22
[58] Field of Search ................................. 372/21, 22, 5, 372/97, 92, 105, 31

[56] References Cited

U.S. PATENT DOCUMENTS

| | | | |
|---|---|---|---|
| 5,307,358 | 4/1994 | Scheps | 372/92 |
| 5,333,142 | 7/1994 | Scheps | 372/22 |
| 5,388,113 | 2/1995 | Oka | 372/22 |
| 5,408,481 | 4/1995 | Scheps | 372/22 |
| 5,552,926 | 9/1996 | Owa et al. | 372/22 |
| 5,699,372 | 12/1997 | Okazaki . | |
| 5,764,662 | 6/1998 | Pinto | 372/22 |
| 5,832,009 | 11/1998 | Kikuchi | 372/22 |

OTHER PUBLICATIONS

Kaneda and Kubota, CW 355 nm Generation by Doubly–Resonant Sum–Frequency Mixing in an External Resonator, Optical Society of America, TOPS on Advanced Solid–State Lasers, vol. 1, 1996.

Berkeland, Cruz, and Bergquist, Sum–frequency generation of continuous–wave light at 194, nm, Applied Optics, vol. 36, No. 18, 1997.

Liu, Dunning, and Tittel, Intracavity sum frequency mixing as a source of tunable cw uv radiation, Optical Society of America, Applied Optics, vol. 21, No. 19, 1982.

Watanabe, Hayasaka, Imajo and Urabe, Continuous–wave sum–frequency generation near 194nm in B–BaB204 crystals with an enhancement cavity, Optical Society of America, Optics Letters, vol. 17, No. 1, 1992.

*Primary Examiner*—Leon Scott, Jr.
*Attorney, Agent, or Firm*—Ipsolon LLP

[57] ABSTRACT

An ultraviolet laser apparatus which generates laser light at 193 nm to 213 nm with high temporal and spatial coherence and relatively high power is disclosed. The UV laser apparatus provides a light source for an exposure device for optical lithography and an aberration measurement interferometer that measures lens wave front aberration. The laser apparatus disclosed herein comprises two lasers having laser resonators that are coincident along a portion of their respective optical paths. A nonlinear optical crystal is located along the shared optical path portion for sum frequency generation of the light of the respective lasers.

26 Claims, 4 Drawing Sheets

ULTRAVIOLET LASER APPARATUS AND SEMICONDUCTOR EXPOSURE APPARATUS

BACKGROUND OF THE INVENTION

1. Field of the Invention

The present invention pertains to an ultraviolet laser apparatus as a light source for an exposure device and for an aberration measurement interferometer.

2. Description of the Related Art

Semiconductor fabricators are motivated to increase semiconductor performance and reduce manufacturing costs, factors that are greatly affected by the semiconductor fabrication process. Optical lithography is a preferred fabrication process for producing semiconductors. An optical lithographic system includes an exposure device, a mask, and resist.

Semiconductor performance is affected by the size of circuits on the semiconductor substrate. Thus, a goal in semiconductor fabrication is to create a small feature size, that is, a minimum size of an object formed semiconductor substrate. The minimum feature size that can be fabricated by an optical lithographic process is proportional to the wavelength of a light source of the exposure device. Previous optical lithographic systems used light from a mercury lamp having a wavelength of 436 to 365 nm. Currently, there is much research to optimize optical lithographic systems that have a laser light source with wavelengths less than 250 nm in order to create a smaller minimum feature size on semiconductors.

Additionally, projection optical systems in exposure devices must meet exacting standards, including low aberration. Such optical system must be evaluated to measure the degree of aberration. Satisfactory evaluation requires that the means for evaluating the optical system use the same wavelength as the light source of the exposure device.

A light source that can produce short wavelength light energy is an ArF excimer laser, which outputs laser light with a wavelength of 193 nm. However, ArF lasers produce light that has undesirably low coherence. Also, ArF excimer lasers are switched lasers that produce pulsed light energy that undesirably damages sensitive optical elements with its strong pulse peak power.

One method, other than ArF lasers, that produces short wavelength light is sum frequency generation (SFG). This method sums the frequencies of two light sources to produce an output light that is of a substantially higher frequency. Because wavelength is inversely proportional to frequency, SFG increases the frequency and decreases the wavelength of light.

A conventional method of performing sum frequency generation uses a nonlinear optical crystal and pulsed laser light from two lasers. By using pulsed laser light, the nonlinear optical crystal does not have to be located in a resonator. Good results may be obtained if laser lights of two wavelengths are made to simultaneously pass through the crystal. However, it has been difficult to achieve long coherence length when using pulsed light as the light source.

Another SFG method discloses first and second lasers and a nonlinear optical crystal located in a first laser resonator. Light from the second laser passes through the crystal only once and does not resonate. Because the second laser light does not resonate, its intensity is weak at the site of the nonlinear optical crystal, resulting in weak output intensity of the SFG light.

Another disclosure proposes an apparatus in which a nonlinear optical crystal is placed in an external resonator which resonates a first laser (a Ti:sapphire laser generating wavelengths from 750 nm to 810 nm). Light from a second laser generating 257 nm wavelength light (frequency doubled argon gas laser with a fundamental wavelength of 515 nm) passes through the crystal once and generates 194 nm light. The second laser light is not resonated, so its intensity is weak at the site of the nonlinear optical crystal, and as a result the intensity of the generated SFG light is about 4 $\mu$W; not suitable for optical lithography.

Yet another proposed method simultaneously introduces two continuous laser lights into one external resonator and controls the lasers so they simultaneously resonate at some wavelength and perform sum frequency generation. This method requires one servo-controlled apparatus to synchronize the external resonator for the first laser, and a second servo-control apparatus to synchronize the wavelength of the second laser with the external resonator. The two servo-controlled apparatuses have the disadvantage of making the structure complicated, and may lead to system instability. Another defect is that coupling efficiency is bad when light from the first and second laser is incident upon the external resonator, efficiency falls and the output power diminishes.

SUMMARY OF THE PRESENT INVENTION

The present invention overcomes the problems state above by providing a high-output ultraviolet laser apparatus, utilizing sum frequency generation, which minimizes the number of servo-control apparatuses required while seeking system simplification and stability. The present invention limits the number of servo stages to one, which resonates each of two laser lights used for sum frequency generation, and supplies two high-intensity laser beams (preferably of different wavelengths) to a nonlinear optical crystal located in the resonator for sum frequency generation.

The present invention achieves an ultraviolet laser apparatus which generates laser light with high temporal and spatial coherence and which has high power output at approximately 193 nm wavelength.

The present invention also provides a Fizeau interferometer which measures lens wave front aberration using the UV laser apparatus of the present invention as a light source.

An embodiment of the present invention provides a UV laser apparatus that can selectively function at 193 nm or 213 nm wavelength as the light source for an exposure device.

The present invention provides a first laser light generation source to generate a first laser light and a first resonator causing the first laser light to resonate, and a second laser light generation source to generate a second laser light and a second resonator causing the second laser light to resonate. The first and second resonators are arranged to share part of the same optical path. A nonlinear optical crystal is located in the shared portion of the optical path for sum frequency generation. Laser light from approximately 190 nm to approximately 215 nm is produced by the sum frequency generation.

A Ti:sapphire laser generating laser light having wavelength in the range from 650 nm to 1100 nm is used as the first laser light generation source. A solid-state laser which includes rare-earth ions generating laser light having wavelengths near 260 nm is used as the second laser light generation source.

Preferably, CW laser light with a wavelength of approximately 193 nm is generated by the sum frequency generation. The wavelength of the Ti:sapphire laser is selected as the first laser light to provide light having a wavelength of approximately 707 nm. Light emitted from a neodymium-doped solid-state laser element is selected as the second laser light, and frequency-quadrupled laser light near 266 nm is generated from the neodymium-doped solid-state laser. The 707 nm Ti:sapphire light and 266 nm quadruple harmonic are coincident at the crystal to provide sum-frequency generated light at 193 nm.

Alternatively, 213 nm wavelength laser light is generated by sum frequency generation. A neodymium-doped solid-state laser element generating light having a wavelength near 1064 nm is used as the first laser. The second laser is a neodymium-doped solid-state laser element that generates 1064 nm light that is frequency-quadrupled to provide laser light near 266 nm. The SFG light of the 1064 nm and 266 nm light is approximately 213 nm.

$\beta$-$BaB_2O_4$, $Sr_2Be_2B_2O_7$ or $KBe_2BO_3F_2$ may be used as the nonlinear optical crystal. Other crystals may also be suitable.

The present invention provides an embodiment in which an ultraviolet laser apparatus having a first nonlinear optical crystal is disposed in a Ti:sapphire laser ring resonator circulating continuous wave light with wavelength from 650 nm to 1100 nm, and laser light from 325 nm to 550 nm is generated. After the generated laser light is taken outside the ring resonator, it enters a second resonator which resonates the CW light having a wavelength from 325 nm to 550 nm. CW light with a wavelength between 162 nm and 225 nm is generated by a second nonlinear optical crystal disposed in the second resonator.

In this embodiment, $LiB_3O_5$ may be used as the first nonlinear optical crystal. $\beta$-$BaB_2O_4$, $Sr_2Be_2B_2O_7$ or $KBe_2BO_3F_2$ may be used as the second nonlinear optical crystal.

Also, an ultraviolet laser apparatus in accordance with the present invention can be used as the laser light source for a lens aberration measurement apparatus and as a laser light source for a semiconductor fabrication exposure apparatus for projecting a mask pattern onto a semiconductor wafer.

It is also possible to provide an ultraviolet laser apparatus in accordance with the present invention to provide phase matching angle change means linked to wavelength changes in one of the two laser lights that changes the phase matching angle of the nonlinear optical crystal in order to efficiently perform the sum frequency generation.

In addition, when controlling phase matching angle change means by linkage to a wavelength controller in a Ti:sapphire laser, it is possible to provide detection means to detect the intensity of laser light generated by sum frequency generation, and to carry out slight adjustments of the phase matching angle change means in response to the detected intensity of laser light.

DETAILED DESCRIPTION OF THE PREFERRED EMBODIMENTS

Figures 5, 6:
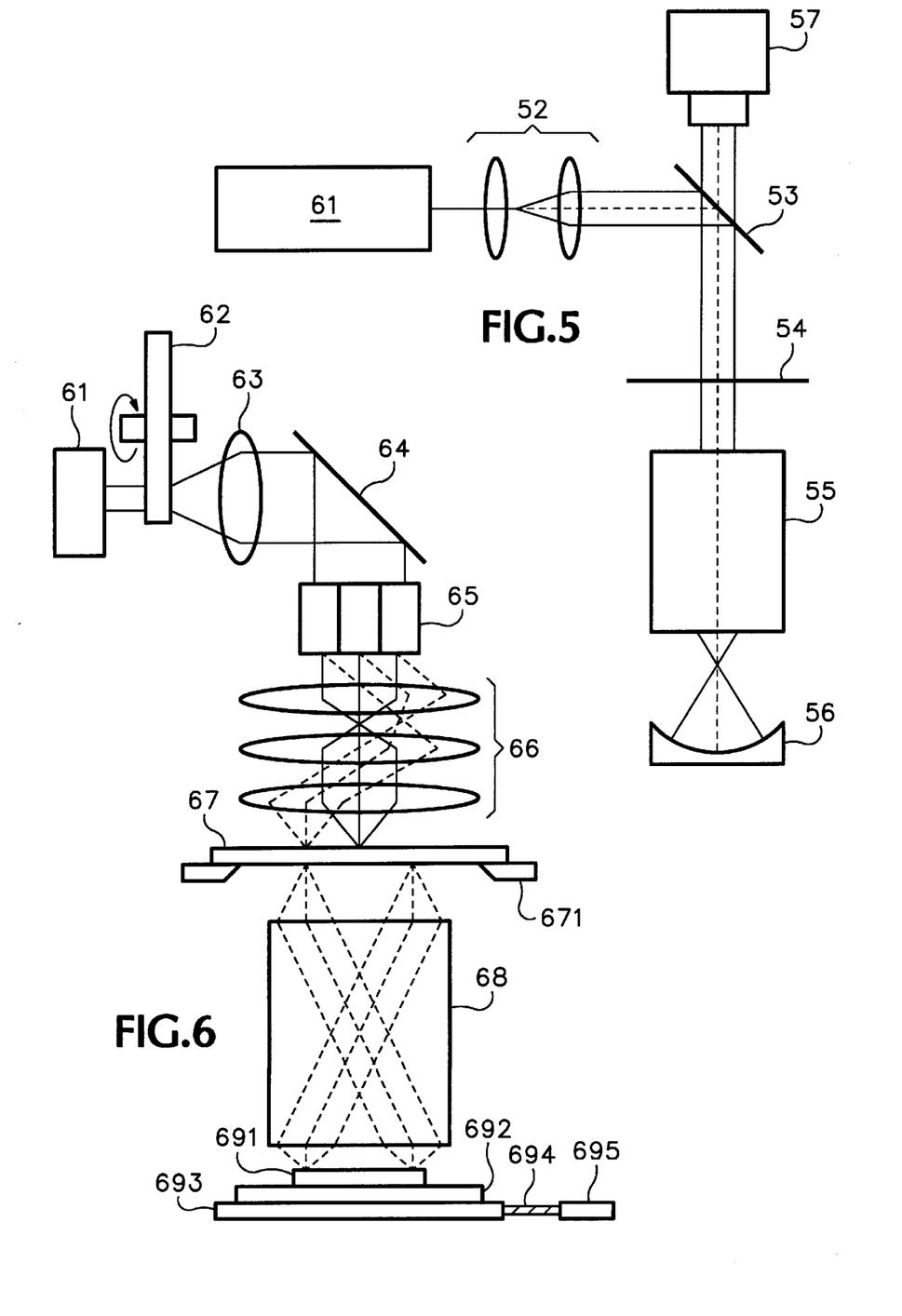
FIG. 5 is a schematic representation of a UV laser light source of the present invention coupled to a lens aberration measurement mechanism.
FIG. 6 is a schematic representation of an exposure apparatus of an optical lithographic system having a UV laser light source of the present invention as a light source.

FIG. 6 is a schematic structural drawing of a projection exposure apparatus 2 having a laser light apparatus 61 of the present invention. Preferably, this projection exposure apparatus uses a continuous wave (CW) ultraviolet light source of the present invention.

The projection exposure apparatus 2 shown in FIG. 6 is provided with a laser light source 61, a rotating dispersion plate 62 for dispersing light emitted from the laser apparatus 61, a lens 63, a reflecting plate 64, which reflects light from laser light source 61 onto a lower fly-eye lens (or integrator lens) 65, an illumination lens system 66, and a mask 67 supported on platform 671. An exposure pattern is drawn on the mask 67. An objective lens 68 focuses the mask pattern onto a semiconductor substrate (or wafer) 691. A moving stage 692 supports substrate 691.

Rotating dispersion plate 62 is rotated by a conventional dispersion plate rotation apparatus (not-shown). Moving stage 692 is supported and can be moved by a moving stage support part 693. A stage drive part 695 and a transmission member 694, which transfers motive power generated by stage drive part 695 to moving stage support part 693 for moving the moving stage 692.

In this projection exposure apparatus, a laser beam from laser light apparatus 61 impinges on rotating dispersion plate 62 and is dispersed thereby. The dispersion plate 62 rotates and changes the laser beam position, so the beam's intensity profile and phase profile change. Accordingly, the speckle patterns are constantly varied and averaged during the exposure time, eliminating the negative effects of illumination irregularities.

Alternately, the dispersion plate 62 may consist of two plates so that irradiation is equalized on the substrate. One plate may be stationary or both may move in different directions.

This dispersed light is incident upon fly-eye lens 65 as a nearly parallel beam from lens 63. Fly-eye lens 65 makes the beam intensity uniform, and the light is illuminated onto mask 67 via illumination lens system 66, which consists of a plurality of lenses.

The circuit pattern on illuminated mask 67 is reduced by a desired demagnification and projected onto semiconductor substrate (or wafer) 691 by projection lens 68. Substrate 691 is placed on moving stage 692, and is scanned and exposed by a movement synchronized with the mask, or by providing a movement mechanism which moves mask 67 on mask support part 671.

The present invention's laser light source uses 193 nm or 213 nm continuous wave ultraviolet light, to provide a short wavelength light that avoids light damage to the illumination lens system and projection lens caused by the strong pulses associated with excimer lasers.

Also, gas replacement and window replacement that is necessary with excimer lasers is not required with the laser light source of the present invention, so semiconductor fabrication throughput can be increased.

The preferred embodiments of the laser light apparatus 61 of the present invention are described below.

First Embodiment

Figure 1:
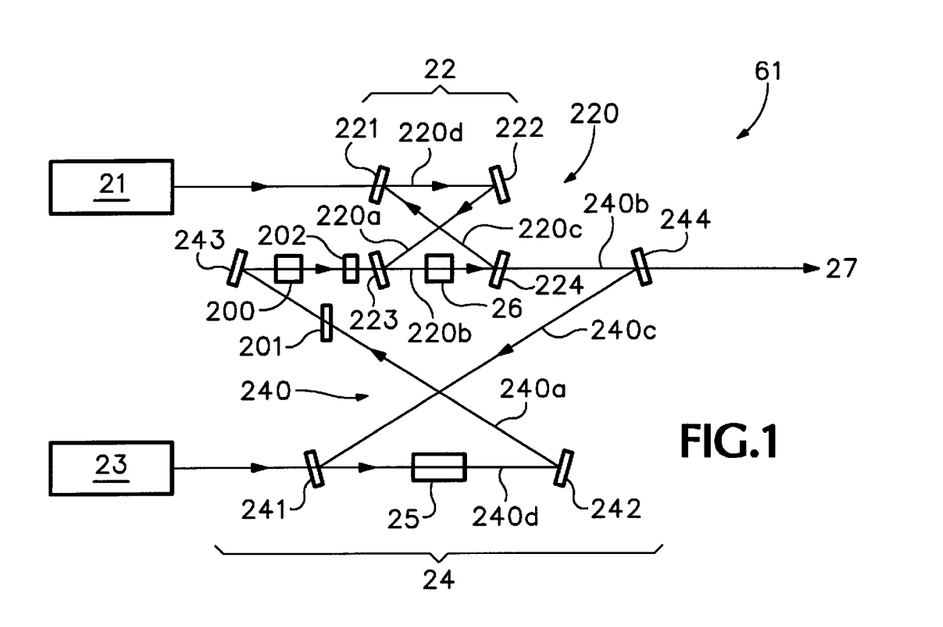
FIG. 1 is a schematic representation of a first embodiment of a UV laser fight source of the present invention.

FIG. 1 shows a schematic view of a first embodiment of a UV laser apparatus 61 in accordance with the present invention.

The laser apparatus in accordance with this embodiment provides a pair of laser light sources 21 and 23 (hereinafter "laser") and their corresponding resonators 22 and 24, which share part of their respective optical paths. A nonlinear crystal 26 is located in the shared portion of the optical path to perform sum frequency generation (SFC) and generate a laser 27 with the desired wavelength.

In FIG. 1, first laser 23 generates CW light near 500 nm at about 5 W, which is used to excite (pump) a Ti:sapphire crystal 25. Laser 23 may be a second harmonic frequency of a 1064 nm Nd:YVO$_4$ laser (producing a laser light at approximately 532 nm). Alternatively, an argon ion laser generating 515 nm or 488 nm may also be used. Excitation light near 500 nm is absorbed by the Ti:sapphire crystal, which generates CW light at 707 nm. Light produced by the Ti:sapphire crystal 25 resonates in a first ring laser resonator 24, consisting of four flat or curved reflecting mirrors 242, 243, 244, 241 that define a first optical path 240 having path portions 240a, 240b, 240c, and 240d. The power of thief 707 nm light circulating inside this resonator 24 is about 30 W.

Mirrors 241, 242, 243, and 244 are reflecting mirrors which are highly reflective (reflectance 99.9% or higher) for light of wavelength 707 nm. Mirror 241 is highly transmissive (transmission factor 95% or higher) for light near 500 nm. Mirror 244 has an adequate transmission factor (transmission factor 80% or higher) for 193 nm light.

An optical diode 200 is located in the first optical path 240 of first resonator 24 to restrict the direction of light movement to the single direction shown by the arrows in FIG. 1 (following the mirror sequence 242-243-244-241). Similarly, a birefringent filter 201 is located in the optical path 240 to select the resonant wavelength and an etalon 202 is located in the optical path 240 to select one longitudinal mode. The use of an optical diode, birefringent filter and etalon in a resonator is known in the art.

A second laser 21 generates CW laser light with a wavelength of approximately 266 nm. Preferably, laser 21 provides a quadruple harmonic of 1064 nm laser light generated by a Nd:YVO$_4$ laser. Its power is approximately 1 W. The 266 nm laser light enters a second resonator 22, which consists of four reflecting mirrors 221, 222, 223, and 224 that define a second optical path 220 having path portions 220a, 220b, 220c, and 220d.

Mirror 221 is a partially transmissive mirror with 98% reflectance for 266 nm light. Mirrors 222, 223, and 224 are highly reflective (reflectance 99.9% or higher) for 266 nm light. Furthermore, mirrors 223 and 224 are highly transmissive (transmission factor 99.7% or higher) for 707 nm light. Also, mirror 224 has an adequate transmission factor (transmission factor 80% or higher) for 193 nm light.

The optical path portions 220b and 240b of resonators 22 and 24, respectively, are substantially coincident.

The resonator length of second resonator 22 is servo-controlled (by a mechanism not shown in FIG. 1) so that it resonates the 266 nm laser light generated by laser 21. The preferred servo-control method used is the FM sideband method (Pound-Draper method).

The FM sideband method requires detection of a resonance frequency error, i.e., a difference between the light frequency and the cavity resonance frequency, from a detection signal of an optical detector (not shown). To detect the frequency difference, the laser light apparatus must modulate laser light through frequency and phase modulation.

Methods of controlling the resonator length include using actuators to change the position of one or more reflecting mirrors or using the electro-optical effect of nonlinear optical crystal 26.

Servo-control is not required for the first resonator 24.

Resonance of 266 nm light inside this resonator 22 leads to the presence of high-intensity 266 nm light The 266 nm power circulating inside resonator 22 is estimated to be about 50 W.

Therefore high intensity (30 W) 707 nm light and high intensity (50 W) 266 nm light are present on the same optical path portion 220b, 240b between reflecting mirrors 223 and 224.

In this preferred embodiment a nonlinear optical BBO crystal ($\beta$-BaB$_2$O$_4$) 26 is located between reflecting mirrors 223 and 224 on the shared optical path 220b, 240b of resonators 22 and 24 to perform sum frequency generation. The preferred cut orientation $\theta$ of BBO crystal 26 (in a coordinate system in which the optical axis is referenced to the crystal axis) is approximately 76°. This is the angle at which SFG of 707 nm light and 266 nm light occurs and is phase-matched to generate 193 nm light. Also, an antireflection coating is applied to both end surfaces of BBO crystal 26 where 707 nm light and 266 nm light enter and exit. This coating provides an adequate transmission factor for 193 nm light at the exit end.

The SFG output power $P_{193}$ is given by the equation: $P_{193}=\eta P_{707}P_{266}$; where $P_{707}$ is 707 nm power and $P_{266}$ is 266 nm power and $\eta$ is a conversion efficiency coefficient determined by beam diameter and crystal length. The value of $\eta$ is approximately $5\times10^{-5}$ W$^{-1}$. In the present embodiment, $P_{707}=30$ W and $P_{266}=50$ W, so the BBO crystal 26 can be expected to generate 193 nm light with $P_{193}=75$ mW. When this 193 nm light passes through the two reflecting mirrors 224 and 244 it is affected by their transmission factors (both 80% or higher), ultimately resulting in output 27 at 193 nm and having approximately 50 mW power.

In this embodiment, the 266 nm second laser light is generated by quadrupling the frequency of a Nd:YVO$_4$ laser. Alternatively, the laser light may be a quadrupled frequency of a Nd:YAG laser or a Nd:YLF laser However, if a Nd:YLF laser's 1047 nm light is used, the quadrupled frequency is 261.8 nm light, so the oscillation wavelength of the titanium sapphire laser is preferably changed to 740 nm, ultimately producing 193 nm light through sum frequency generation.

Also, in this embodiment, the preferred crystal 26 for sum frequency generation is the BBO ($\beta$-BaB$_2$O$_4$), but Sr$_2$Be$_2$B$_2$O$_7$ or KBe$_2$BO$_3$F$_2$ crystals may be also be used. These crystals absorb little 193 nm fight and have acceptable damage threshold values, so high output can be expected with little damage.

Second Embodiment

Figure 2:
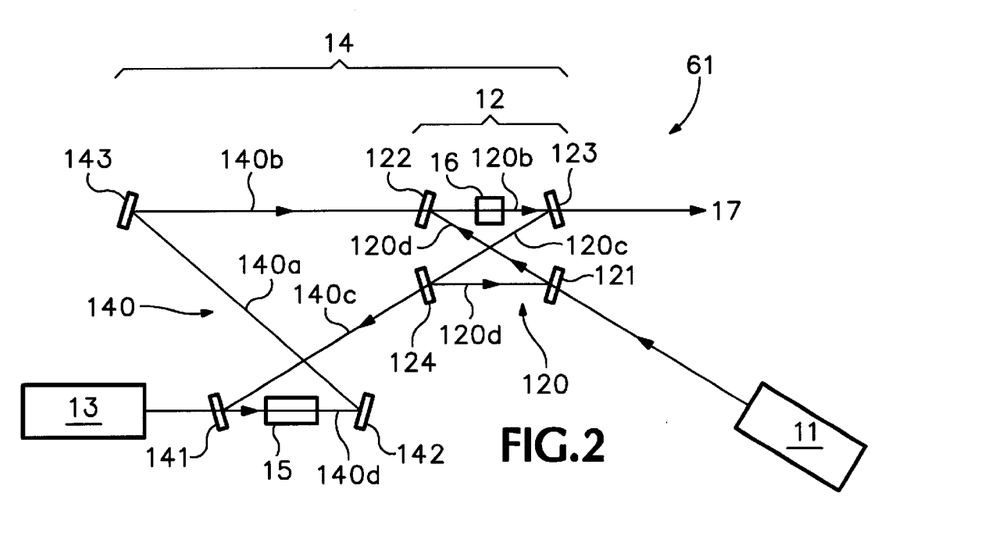
FIG. 2 is a schematic representation of a second embodiment of a UV laser light source of the present invention.

FIG. 2 shows a schematic representation of a second embodiment of a UV laser apparatus 61 of the present invention. This embodiment is substantially similar to the first embodiment described above but the arrangement of the lasers and resonators is different.

In FIG. 2, laser 13 excites a Ti:sapphire crystal 15 (similar to laser 23 and Ti:sapphire crystal 25 of FIG. 1).

A first resonator 14 comprises four flat or curved reflecting mirrors 141, 142, 143, and 123 defining optical path 140 having portions 140a, 140b, 140c, and 140d. Reflecting mirrors 141, 142, and 143 have the same performance as 241, 242, and 243, respectively. That is, mirrors 141, 142 and 143 are highly reflective for 707 nm light and mirror 141 is highly transmissive for light near 500 nm.

In this second embodiment, reflecting mirror 123 is shared by a second resonator 12, as described below. Reflecting mirror 123 is highly reflective (reflectance 99.9% or higher) for both 707 nm light and 266 nm light, and adequately transmits 193 nm light (transmission factor 80% or higher).

An optical diode and a birefringent filter and an etalon (not shown in FIG. 2) are incorporated in the first resonator 14, in the same manner as described above in connection with the first embodiment. About 30 W of 707 nm light is expected to circulate in resonator 14.

A second laser 11 generates 266 nm CW light at a power of approximately 1 W. This laser may be a quadruple frequency of a 1064 nm Nd:YVO$_4$ as described in connection with laser 21 of the first embodiment.

The second resonator 12 comprises four flat or curved reflecting mirrors 121, 122, 123, and 124 that define a second optical path 120 having portions 120a, 120b, 120c, and 120d. Reflecting mirror 121, upon which laser light is incident is partially transmissive with 98% reflectance for 266 nm light. Reflecting mirrors 122 and 124 are highly reflective (reflectance 99.9% or higher) for 266 nm light, but have high transmission (transmission factor 99.7% or higher) for 707 nm light. Reflecting mirror 123, as described earlier, is shared by the first resonator 14 and second resonator 12.

In the same manner as in the first embodiment, second resonator 12 is servo-controlled by the FM sideband method so that it is synchronized with incident 266 nm laser light. About 50 W of 266 nm light is expected to resonate in resonator 12.

The first resonator 14 and second resonator 12 have coincident optical paths 120b and 140b between reflecting mirrors 122 and 123 and paths 120c and 140c between mirrors 123 and 124.

In this embodiment, a BBO crystal 16 for sum frequency generation is located in the optical path between reflecting mirror 122 and 123. Preferably, crystal 16 is a BBO crystal, but Sr$_2$Be$_2$B$_2$O$_7$ or KBe$_2$BO$_3$F$_2$ crystals may also be suitable.

In this embodiment, as in the first embodiment, the generated 193 nm power which can be predicted from sum frequency generation is about 75 mW. When this laser light passes through reflecting mirror 123, it is affected by the transmission factor (80% or higher), and 193 nm output 17 of about 60 mW is generated.

Third Embodiment

Figure 3:
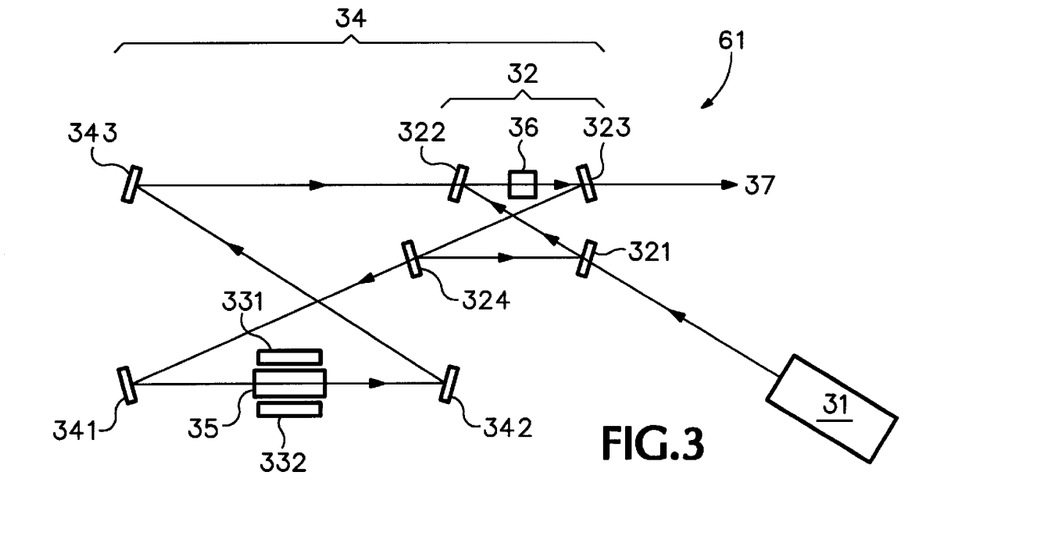
FIG. 3 is a schematic representation of a third embodiment of a UV laser light source of the present invention.

FIG. 3 shows a schematic representation of a third embodiment of a UV laser apparatus in accordance with the present invention. This embodiment is similar to the second embodiment described above, except as noted below.

In this embodiment, the Ti:sapphire laser of the second embodiment is replaced with a Nd:YAG laser crystal 35 (wavelength 1064 nm).

A laser diode array having diode lasers 331 and 332 generate laser light near 808 nm to side pump Nd:YAG laser 35. The total output of laser diode array 331 and 332 is 20 W. The 1064 nm power circulating inside resonator 34 is approximately 200 W.

An optical diode to restrict the light direction, a birefringent filter, and an etalon (not shown in FIG. 3) are disposed inside resonator 34 in the same manner as in the first and second embodiments. However, because the Nd:YAG crystal oscillation bandwidth is narrow, the birefringent filter may be omitted.

A first resonator 34 comprises four flat or curved reflecting mirrors 341, 342, 343, and 323 defining optical path 340 having portions 340a, 340b, 340c, and 340d. Reflecting mirrors 341, 342, and 343 are highly reflective for 1064 nm light.

A second laser 31 is provided that is substantially similar to laser 11 of the second embodiment.

The second resonator 32 comprises four flat or curved reflecting mirrors 321, 322, 323, and 324 that define a second optical path 320 having portions 320a, 320b, 320c, and 320d. Reflecting mirror 321, upon which laser light is incident is partially transmissive with 98% reflectance for 266 nm light. Reflecting mirrors 322 and 324 are highly reflective (reflectance 99.9% or higher) for 266 nm light, but have high transmission (transmission factor 99.7% or higher) for 1064 nm light. Reflecting mirror 323 is shared by the first resonator 34 and second resonator 32.

The cut orientation, θ, of the BBO crystal 36 for sum frequency generation (in a coordinate system in which the optical axis is referenced to the crystal axis) is approximately 51°. This is the angle at which SFG of 1064 nm light and 266 nm light occurs and are phase-matched to gene ate 213 nm light.

BBO sum frequency generation output $P_{213}$ is given by: $P_{213}=\eta P_{1064} P_{266}$; where $P_{1064}$ is 1064 nm power and $P_{266}$ is 266 nm power. η is a conversion efficiency coefficient determined by beam diameter and crystal length; the value of η is about $1 \times 10^{-4}$ W. In this case $P_{1064}=200$ W and $P_{266}=50$ W, so the BBO crystal can be expected to generate 213 nm light with $P_{213}=1$ W. When this 213 nm light passes through reflecting mirror 323 it is affected by its transmission factor (80% or higher), ultimately resulting in 213 nm laser light output 37 of about 800 mW.

Fourth Embodiment

Figure 4:
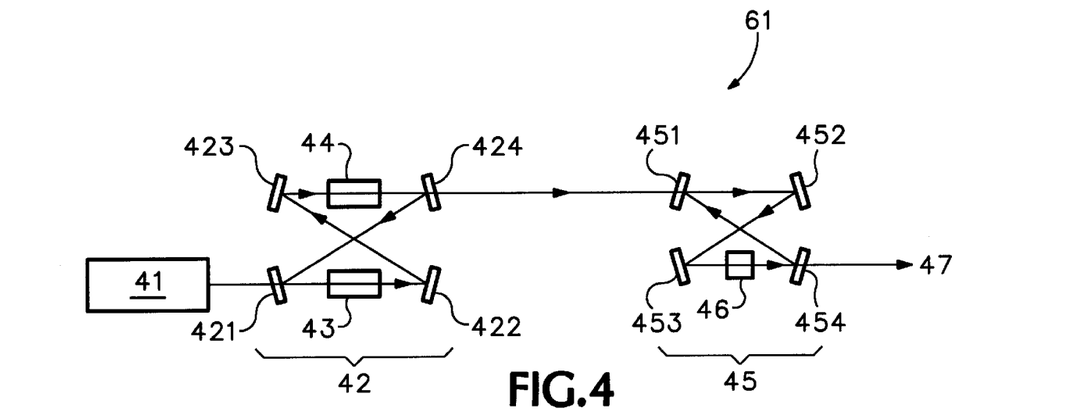
FIG. 4 is a schematic representation of a fourth embodiment of a UV laser light source of the present invention.

FIG. 4 shows a schematic representation of a fourth embodiment of a UV laser apparatus 61 in accordance with the present invention.

This embodiment provides a UV laser apparatus 61 with a simpler structure from the embodiments described above and that generates light near 193 nm and shorter wavelengths using one CW laser and an SBBO crystal.

In FIG. 4, an excitation laser 41 generates laser light with a wavelength near 500 nm and pumps Ti:sapphire crystal 43 which generates light at 772 nm. The output of excitation laser 41 is approximately 5 W. Preferably, this laser is an argon ion laser. Alternatively, it may also be a second harmonic frequency (532 nm) of a Nd:YAG laser or second harmonic frequency (532 nm) of a Nd:YVO$_4$ laser.

A first ring resonator 42, consisting of four flat or curved reflecting mirrors 421, 422, 423, and 424, resonates the 772 nm light from the Ti:sapphire crystal 43. High-power 772 nm light is circulated in the resonator 42. Reflecting mirrors 421, 423, 422 and 424 are highly reflective (reflectance 99.9% or higher) for 772 nm light. In addition, reflecting mirror 421 also has high transmission (transmission factor 95% or higher) of excited light with wavelength near 500 nm. Also, reflecting mirror 424 has a transmission factor of 90% or higher for light with wavelength 386 nm. The power of the 772 nm light circulating inside this laser resonator 42 is estimated to be 50 W.

Resonator 42, in the same manner as in the embodiments described, includes an optical diode, a birefringent filter, and an etalon (not shown in FIG. 4). The diode restricts the direction of light circulation to one direction. The birefringent filter selects the oscillation wavelength and the etalon selects the longitudinal mode.

The 772 nm light is converted to 386 nm light by a nonlinear optical crystal 44 Preferably crystal 44 is an LBO ($LiB_3O_5$) crystal located in resonator 42 to produce double frequency generation of the 772 nm light The power of the 386 nm light that is transmitted by mirror 424 is estimated to be 250 mW.

This 386 nm light is incident upon a second resonator 45. Resonator 45 is controlled by a servo-control circuit (not shown in FIG. 4) to synchronize the resonator with the 386 nm light. The FM sideband method is preferred as the detection method.

Resonator 45 consists of four flat or curved reflecting mirrors 451, 452, 453, and 454. Reflecting mirror 451 is a partial reflecting mirror with about 99% reflectance and about 1% transmission factor for 386 nm light. Reflecting mirrors 452, 453, and 454 are highly reflective (reflectance 99.9% or higher) for 386 nm light. Additionally, reflecting mirror 454 has a transmission factor of 80% or higher for 193 nm light Light with wavelength 386 nm circulates in resonator 45, and its power is estimated to be about 25 W.

In this embodiment, a $Sr_2Be_2B_2O_7$ crystal 46 is provided inside resonator 45 for double frequency generation of the 386 nm light to produce 193 nm light. The laser light which is generated can be considered a quadrupled frequency of the fundamental 772 nm light The power of this quadrupled frequency is predicted to be about 50 mW. This 193 nm light passes through reflecting mirror 454, with a transmission factor of 80% or higher, and is led outside as laser light 47 at 193 nm and having power of approximately 40 mW.

Alternatively, the crystal 46 may by a $KBe_2BO_3F_2$ crystal. A BBO ($\beta$-$BaB_2O_4$) crystal cannot be used to provide wavelengths shorter than 205 nm in a frequency doubling generation system, so it cannot generate 193 nm light. But in this embodiment it is possible to generate wavelengths longer than 205 nm when using a $\beta$-$BaB_2O_4$ crystal.

Fifth Embodiment

The laser apparatus in the first, second, and fourth embodiments used a Ti:sapphire laser. Ti:sapphire lasers oscillate at one wavelength in the range from 650 nm to 1100 nm. The wavelength is selected by inserting a birefringent filter in the laser resonator and controlling its rotation angle.

If the oscillation wavelength of a Ti:sapphire laser is changed, the crystals 16 or 26 of FIGS. 1 or 2 (for sum frequency generation) or crystals 44 and 46 of FIG. 4 (for harmonic generation) need to have different angles of incidence relative to the optical axis to maintain phase matching conditions. This phase matching angle is determined by the wavelength of light incident upon the crystal and the wavelength of light generated.

This embodiment detects the angle of rotation of a birefringent filter and controls the angle of the wavelength conversion crystal for phase matching. This embodiment shall be explained with reference to FIGS. 7 and 8.

Figure 7:
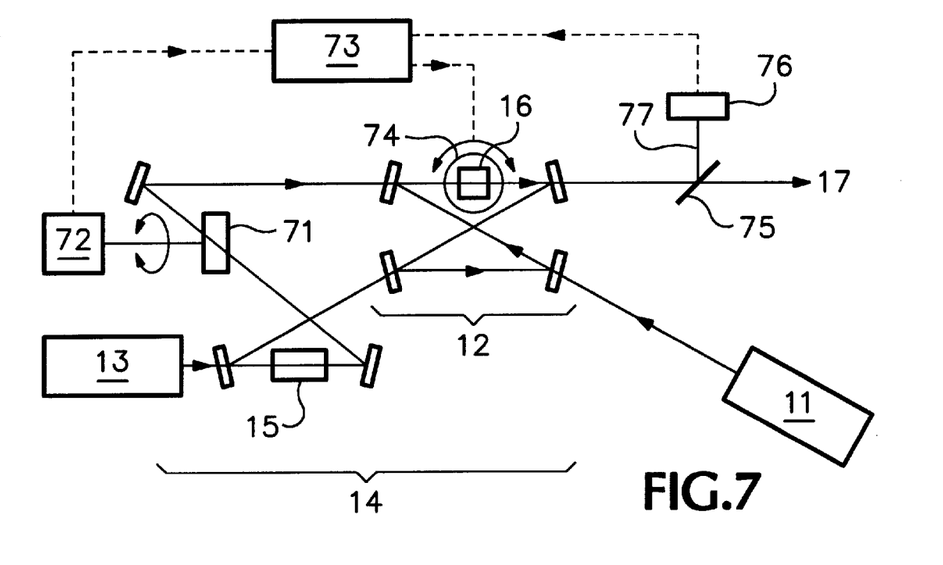
FIG. 7 is a schematic representation of a UV laser light source of the present invention having means to detect light intensity and control crystal angle or birefringence angle.

FIG. 7 shows a Ti:sapphire laser light source according to the second embodiment shown In FIG. 2. A birefringent filter 71 inserted into the resonator selects the laser oscillation wavelength by being rotated around its rotational axis.

The angle of rotation of this birefringent filter 71 is read by an encoder 72. A controller 73 receives the encoder information and determines the laser's oscillation wavelength, and calculates the optimum crystal (BBO or $Sr_2Be_2B_2O_7$) angle for this oscillation wavelength. The controller controls the angle of the crystal 16 by moving a rotating stage 74 that supports the crystal 16 to maximize the power of sum frequency generation light at 193 nm. Such rotating stages are known in the art.

Preferably, the angle of rotation of the birefringent filter 71 is manually controlled to produce the desired wavelength. Alternatively, controller 73 can move the filter 71 by means of an actuator (not shown).

Also, an etalon and optical diode (hot shown) are inserted in the optical path in this resonator in the manner described above. The etalon restricts longitudinal oscillation modes to one, and the optical diode restricts the light propagation direction to one direction.

It is also possible that a portion 77 of output light 17 is diverted by a beam splitter 75 to a detector 76 that detects the intensity of the light portion 77 and provides an electrical signal indicative of the light intensity. Thus, the output of sum frequency generation light (193 nm) can be monitored and controller 73 may perform fine adjustments on rotating stage 74 to adjust crystal 16 in order to maximize the output laser light 17.

Figure 8:
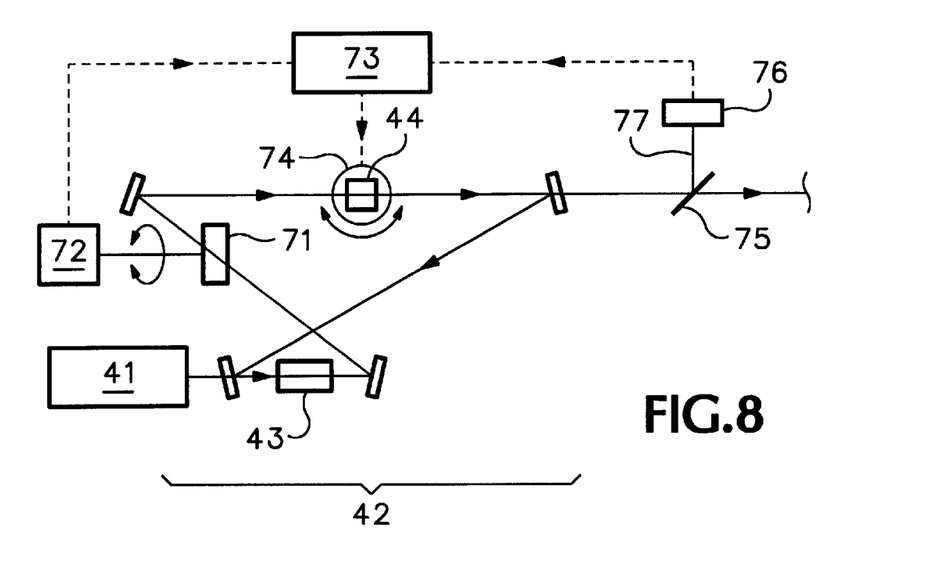
FIG. 8 is a schematic representation of second embodiment of a UV laser light source of the present invention having means to detect light intensity and control crystal angle or birefringence angle.

FIG. 8 shows this detect and control method applied to the Ti:sapphire laser section 42 of the fourth embodiment (shown in the FIG. 4). Here, birefringent filter 71, encoder 72, controller 73, and rotating stage 74, are the same as in FIG. 7.

In the embodiment of FIG. 8, LBO crystal 44 converts the 772 nm light generated by Ti:sapphire crystal 43 into light near 386 nm. In response to this, beam splitter 75 and detector 76 select the angles of the crystal that are most suitable for generating 386 nm light. Furthermore, in the same manner as in the first embodiment, an etalon and optical diode (not shown) are inserted in the resonator.

Similarly, the angle of crystal 46, which generates light near 193 nm, can also be adjusted by controller 73.

FIG. 5 is a schematic representation of a Fizeau interferometer for measuring optical system aberration in an exposure device, using the ultraviolet laser apparatus 61 of the present invention as a light source.

The beam diameter of light from laser apparatus 61 is expanded by beam expander 52 and then bent downward by half mirror 53 onto a second half mirror 54.

Part of the light is reflected by half mirror 54, the reference plane, and returns upward and passes through half mirror 53 and is incident upon observation camera 57 as reference light. A CCD camera is preferred.

Meanwhile, light which passes through mirror 54 passes through optical system 55 (the optical system under observation), and then is reflected back by reflecting mirror 56. The reflected light again passes through optical system 55, mirror 54, and half mirror 53 and is incident upon observation camera 57 as measurement light.

Aberration in the optical system 55 is measured at the camera's image plane using the reference light and measurement light. When measuring aberration, it is a common practice to use a method in which the optical path length is changed by about one wavelength and to observe changes in the interference fringes. The optical path may by changed by moving mirror 56 or 54, as is known in the art.

This embodiment makes it possible to provide a Fizeau interferometer which uses as its light source an ultraviolet laser apparatus which generates 193 nm light, etc., with high temporal and spatial coherence, and moreover with high output.

Furthermore, the ultraviolet laser apparatus 61 of the present invention can be used with other measurement or inspection apparatuses that measure image character or quality. Image character includes position of the image along the optical axis; magnification; and aberration (spherical aberration, coma aberration, astigmatism, field curvature, distortion, and wave front aberratibily).

The previous embodiment uses an ultraviolet laser apparatus which generates a CW laser at 193 nm wavelength with high coherence and relatively high power. This ultraviolet laser apparatus provides a suitable light source for a Fizeau interferometer to perform wave front aberration measurement at 193 nm to 213 nm.

In addition, the light source of the present invention provides a short wavelength (193 nm to 213 nm) CW light source having suitable power for an exposure device as described above.

This specification describes materials, shapes, configurations, and arrangements of parts for making and using the invention. Such descriptions are provided to teach the best modes of the invention and enable a skilled person to make and use the invention. It is intended that the scope of the patented invention shall be only limited by the language of the claims and the law of the land as pertains to valid U.S. patents.

What is claimed is:

1. An ultraviolet laser apparatus comprising:
   (a) a first laser light generation source to generate first laser light and a first resonator resonating the first laser light, the first resonator defining a first optical path of the first laser light; and
   (b) a second laser light generation source to generate second laser light and a second resonator resonating the second laser light, the second resonator defining a second optical path of the second laser light; and
   (c) a nonlinear optical crystal;
   (d) whereby the first and second resonators are arranged such that a portion of the first optical path is substantially coincident with a portion of the second optical path and the nonlinear optical crystal is located along the substantially coincident optical path to provide an ultraviolet output laser light that is a sum frequency generation of the first and second laser lights.

2. The ultraviolet laser apparatus of claim 1, wherein:
   (a) the first laser light generation source is a Ti:sapphire laser generating laser light having a wavelength between 650 nm and 1100 nm;
   (b) the second laser right generation source is a solid-state laser generating laser light having a wavelength of approximately 266 nm; and
   (c) the sum frequency generation output laser light has a wavelength between 180 nm and 215 nm.

3. The ultraviolet laser apparatus of claim 2, wherein:
   (a) the wavelength of the laser light of the Ti:sapphire laser is approximately 707 nm;
   (b) the solid-state laser is a neodymium-doped laser having wavelength of approximately 1064 nm and frequency-quadrupled laser light near 266 nm is generated from the second laser light generation source; and
   (c) the sum frequency generation output laser light is a continuous wave laser light having a wavelength of approximately 193 nm.

4. The ultraviolet laser apparatus of claim 1, wherein:
   (a) the first laser light generation source is a neodymium-doped solid-state laser providing laser light having a wavelength of approximately 1064 nm;
   (b) the second laser light generation source is a neodymium-doped solid-state laser providing laser light having a wavelength of approximately 1064 nm and frequency-quadrupled laser light having a wavelength of approximately 268 nm is generated from the second laser light generation source; and
   (c) output laser light having a wavelength of approximately 213 nm is generated by the sum frequency generation.

5. The ultraviolet laser apparatus of claim 1, wherein the nonlinear crystal is a $\beta$-$BaB_2O_4$ crystal.

6. The ultraviolet laser apparatus of claim 1, wherein the nonlinear crystal is a $Sr_2Be_2B_2O_7$ crystal.

7. The ultraviolet laser apparatus of claim 1, wherein the nonlinear crystal is a $KBe_2BO_3F_2$ crystal.

8. The ultraviolet laser apparatus of claim 1, wherein the first resonator and second resonator are ring resonators.

9. The ultraviolet laser apparatus of claim 8, wherein one mirror is shared by the first resonator and the second resonator.

10. The ultraviolet laser apparatus of claim 8, wherein at least one mirror is a shared mirror of the first resonator and second resonator and the shared mirror is substantially transmissive of light having a wavelength of the output laser light.

11. The ultraviolet laser apparatus of claim 1, wherein the second resonator is servo-controlled to control a length of the second resonator.

12. The ultraviolet laser apparatus of claim 1, further comprising an optical element aberration measurement apparatus which measures aberration of an optical element, comprising:
   (a) an optical element; and
   (b) a beam splitter that splits the output laser light into a reference light and a measurement light and the measurement light passes through the optical element and the reference light does not pass through the optical element, and wherein the measurement light and reference light are made to interfere along a common light path that is directed to a sensor that detects light interference and the interference is a measure of aberration of the optical element.

13. An ultraviolet laser apparatus, comprising:
   (a) a source of first laser light having a wavelength between 650 nm and 1100 nm;
   (b) a first resonator that resonates the first laser light, the first resonator defining a first optical path;
   (c) a first nonlinear optical crystal located along the first optical path, the crystal doubling the frequency of the first laser light to provide a second laser light having a wavelength between 325 nm and 550 nm; and
   (d) a second resonator that resonates the second laser light, the second resonator defining a second optical path; and
   (e) a second nonlinear optical crystal located along the second optical path, the second optical crystal doubling the frequency of the second laser light to provide continuous wave output laser light having a wavelength between 162 nm and 225 nm.

14. The ultraviolet laser apparatus of claim 13, wherein
(a) the source of first laser light is a Ti:sapphire crystal that provides continuous wave light having a wavelength of approximately 772 nm; and
(b) the second laser light has a wavelength of approximately 386 nm;
(c) the continuous wave output laser light has a wavelength of approximately 193 nm.

15. The ultraviolet laser apparatus of claim 13, wherein the first nonlinear crystal is a $LiB_3O_5$ crystal.

16. The ultraviolet laser apparatus of claim 13, wherein the second nonlinear crystal is a $\beta$-$BaB_2O_4$ crystal.

17. The ultraviolet laser apparatus of claim 13, wherein the second nonlinear crystal is a $Sr_2Be_2B_2O_7$ crystal.

18. The ultraviolet laser apparatus of claim 13, further comprising an optical element aberration measurement apparatus which measures aberration of an optical element, comprising:
(a) an optical element; and
(b) beam splitter that splits the output laser light to form a reference light and a measurement light, and the measurement light passes through the optical element and the reference light does not pass through the optical element, and wherein the measurement light and reference light are made to interfere.

19. An exposure apparatus for projecting a mask pattern onto a semiconductor wafer, the exposure apparatus comprising:
(a) a first laser light generation source to generate first laser light and a first resonator that resonates the first laser light, the first resonator defining a first optical path of the first laser light;
(b) a second laser light generation source to generate second laser light and a second resonator that resonates the second laser light, the second resonator defining a second optical path of the second laser light; and
(c) a nonlinear optical crystal;
(d) whereby the first and second resonators are arranged such that a portion of the first optical path is substantially coincident with a portion of the second optical path thereby forming a shared optical path and the nonlinear optical crystal is located along the shared optical path to provide an output laser light that is a sum frequency generation of the first and second laser lights; and
(e) an optical element that guides output laser light through a mask so as to project a mask pattern onto a wafer.

20. The ultraviolet laser apparatus of claim 19, wherein:
(a) the first laser light generation source is a Ti:sapphire laser generating laser light having a wavelength between 650 nm and 1100 nm; and
(b) the second laser light generation source is a solid-state laser generating laser light having a wavelength of approximately 266 nm; and
(c) the sum frequency generation output laser light has a wavelength between 180 nm and 215 nm.

21. The ultraviolet laser apparatus of claim 19, wherein:
(a) the first laser light generation source is a neodymium solid-state laser providing laser light having a wavelength of approximately 1064 nm;
(b) the second laser light generation source is a neodymium solid-state laser providing laser light having a wavelength of approximately 1064 nm and frequency-quadrupled laser light having a wavelength of approximately 266 nm is generated from the second laser light generation source; and
(c) output laser light having a wavelength of approximately 213 nm is generated by the sum frequency generation.

22. A laser apparatus, comprising:
(a) a first laser providing first laser light having a wavelength and a first resonator that resonates the first laser light at a resonance wavelength and a wavelength selector for tuning the wavelength of the laser light in the first resonator;
(b) a second laser providing second laser light and a second resonator that resonates the second laser light;
(c) a nonlinear optical crystal, wherein the first and second laser lights are incident upon the crystal at a phase matching angle; and
(d) an actuator that changes the phase matching angle of the crystal to provide sum frequency generation laser light of the first and second lasers.

23. The ultraviolet laser apparatus of claim 22, further comprising a detector for detecting the resonance wavelength of the first laser light.

24. The ultraviolet laser apparatus of claim 22 further comprising a detector for detecting the resonance wavelength of the first laser light and providing a first signal indicative of the resonance wavelength, and a controller for receiving the first signal and controlling the actuator in response to the first signal.

25. The ultraviolet laser apparatus of claim 22, wherein the wavelength selector is a birefringent filter.

26. The ultraviolet laser apparatus of claim 22, further comprising a detector to detect the intensity of the sum frequency generated laser light, and producing a signal indicative of the intensity, and a controller that receives the signal and controls the actuator to adjust the phase matching angle in response to the signal.

* * * * *